US007800122B2

(12) United States Patent
Chiu et al.

(10) Patent No.: US 7,800,122 B2
(45) Date of Patent: Sep. 21, 2010

(54) LIGHT EMITTING DIODE DEVICE, AND MANUFACTURE AND USE THEREOF

(75) Inventors: Kuo An Chiu, New Territories (HK);
Jian Feng, New Territories (HK);
Huaijun Peng, New Territories (HK);
Hung Shen Chu, New Territories (HK);
Shengmei Zheng, Clear Water Bay (HK)

(73) Assignee: Hong Kong Applied Science and Technology Research Institute Co., ltd., New Territories, Hong Kong Sar (CN)

( * ) Notice: Subject to any disclaimer, the term of this patent is extended or adjusted under 35 U.S.C. 154(b) by 592 days.

(21) Appl. No.: 11/516,564

(22) Filed: Sep. 7, 2006

(65) Prior Publication Data

US 2008/0061310 A1 Mar. 13, 2008

(51) Int. Cl.
*H01L 33/10* (2010.01)

(52) U.S. Cl. .......... 257/98; 257/E33.067; 257/E33.068; 257/E33.074

(58) Field of Classification Search .................. 257/79, 257/88, 95, 98, E33.067, E33.068, E33.074
See application file for complete search history.

(56) References Cited

U.S. PATENT DOCUMENTS

| 1,384,659 | A | 7/1921 | Bérnard |
| 1,990,390 | A | 2/1935 | Rudy, Jr. |
| 2,344,221 | A | 3/1944 | Trautner |
| 3,646,338 | A | 2/1972 | Goytisolo |
| 3,739,169 | A | 6/1973 | Weinreich |
| 4,192,994 | A | 3/1980 | Kastner |
| 4,371,916 | A | 2/1983 | De Martino |
| 4,698,730 | A | 10/1987 | Sakai et al. |
| 5,140,220 | A | 8/1992 | Hasegawa |
| 5,335,157 | A | 8/1994 | Lyons |
| 5,404,282 | A | 4/1995 | Klinke et al. |

(Continued)

FOREIGN PATENT DOCUMENTS

CN 1368764 9/2002

(Continued)

OTHER PUBLICATIONS

International Search Report Application No. PCT/CN2007/070243 dated Sep. 20, 2007.

*Primary Examiner*—Sue Purvis
*Assistant Examiner*—Eduardo A Rodela
(74) *Attorney, Agent, or Firm*—Buchanan Ingersoll & Rooney PC

(57) ABSTRACT

A light emitting diode device includes a multi-layer stack of materials including a p-layer, a n-layer, and a light generating region for emission of light in a primary emission direction towards one of the p- and n-layers; a substantially transparent layer located at or adjacent said one of the p- and n-layers, having a first surface facing said one of the p- and n-layers and an opposed second surface; and a reflective surface formed at or adjacent the second surface of the transparent layer for directing at least a portion of the emitted light in a direction away from the primary emission direction so as to enhance light emission from a side of the light emitting diode device.

14 Claims, 11 Drawing Sheets

U.S. PATENT DOCUMENTS

| | | |
|---|---|---|
| 5,452,190 A | 9/1995 | Priesemuth |
| 5,608,290 A | 3/1997 | Hutchisson et al. |
| 5,777,433 A | 7/1998 | Lester et al. |
| 5,806,955 A | 9/1998 | Parkyn, Jr. et al. |
| 5,894,195 A | 4/1999 | McDermott |
| 5,894,196 A | 4/1999 | McDermott |
| 5,897,201 A | 4/1999 | Simon |
| 5,898,267 A | 4/1999 | McDermott |
| 6,030,099 A | 2/2000 | McDermott |
| 6,048,083 A | 4/2000 | McDermott |
| 6,091,083 A * | 7/2000 | Hata et al. ............ 257/79 |
| 6,177,761 B1 | 1/2001 | Pelka et al. |
| 6,679,621 B2 | 1/2004 | West et al. |
| 6,784,463 B2 * | 8/2004 | Camras et al. ........ 257/99 |
| 6,899,443 B2 | 5/2005 | Rizkin et al. |
| 6,940,099 B2 | 9/2005 | Hata et al. |
| 6,995,402 B2 | 2/2006 | Ludowise et al. |
| 7,470,938 B2 * | 12/2008 | Lee et al. ............ 257/103 |
| 7,582,910 B2 * | 9/2009 | David et al. .......... 257/86 |
| 2004/0188689 A1 * | 9/2004 | Shono et al. .......... 257/79 |
| 2005/0001537 A1 | 1/2005 | West et al. |
| 2005/0093008 A1 * | 5/2005 | Suehiro et al. ........ 257/98 |
| 2007/0085102 A1 * | 4/2007 | Orita ................ 257/98 |
| 2009/0267085 A1 * | 10/2009 | Lee et al. ............ 257/88 |

FOREIGN PATENT DOCUMENTS

| | | |
|---|---|---|
| CN | 1458701 | 11/2003 |
| CN | 1527408 | 9/2004 |
| CN | 1624944 | 6/2005 |
| CN | 1645637 | 7/2005 |
| CN | 1257562 | 5/2006 |
| CN | 1790753 | 6/2006 |
| JP | 2006-013034 | 1/2006 |
| WO | WO 2005/015647 | 2/2005 |

* cited by examiner

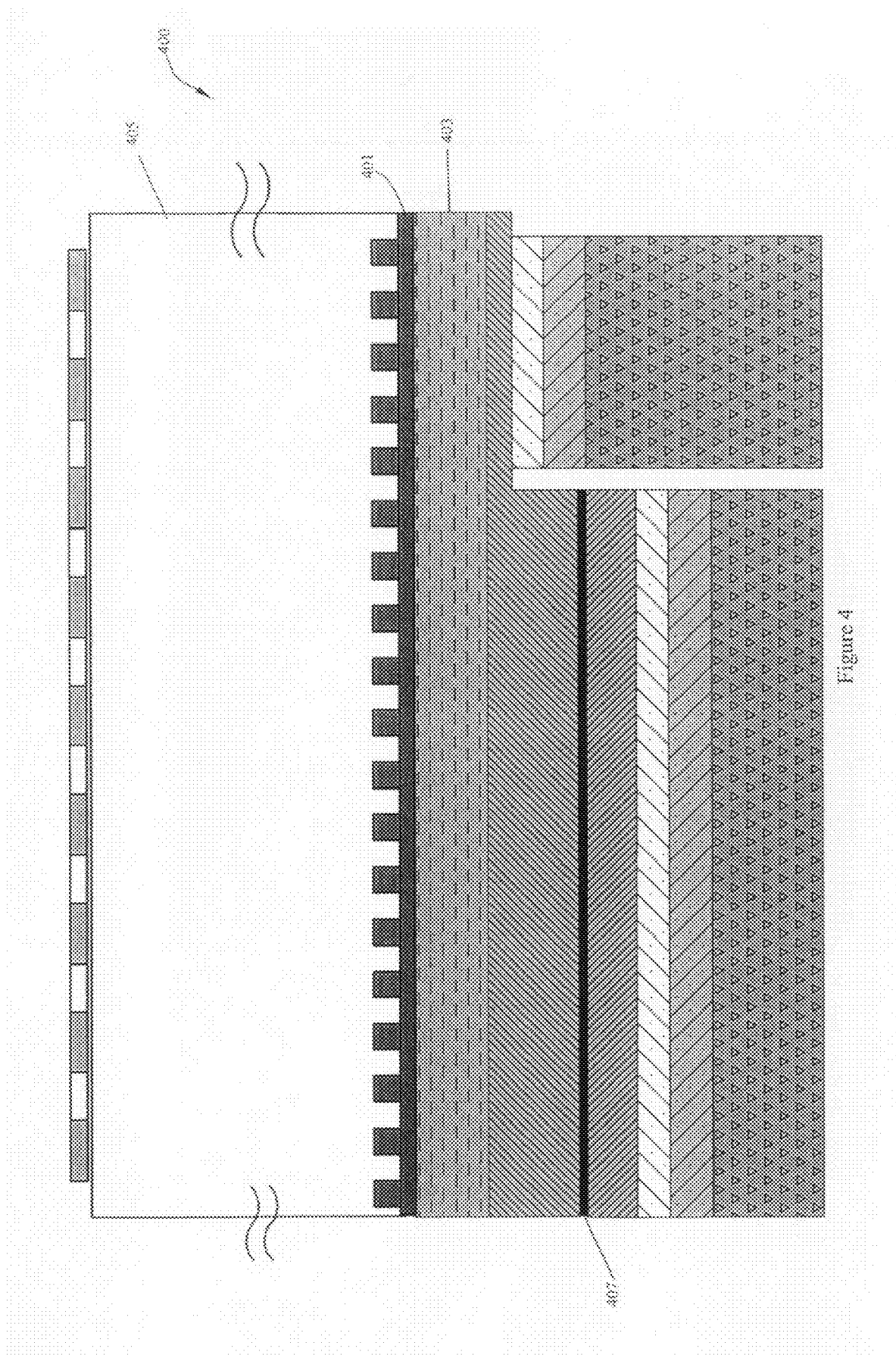

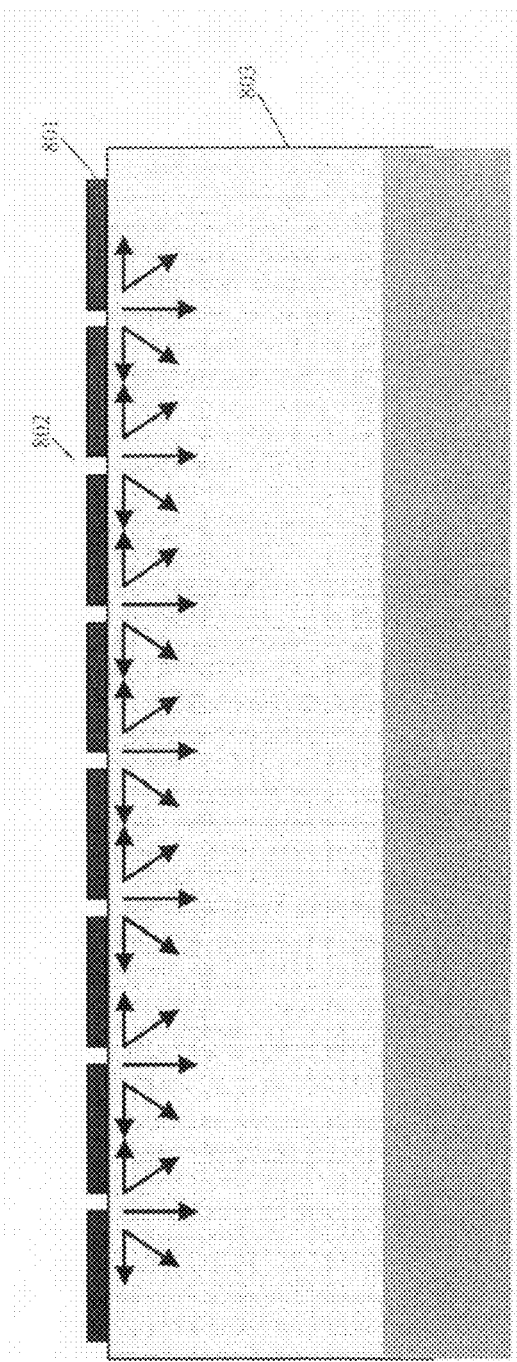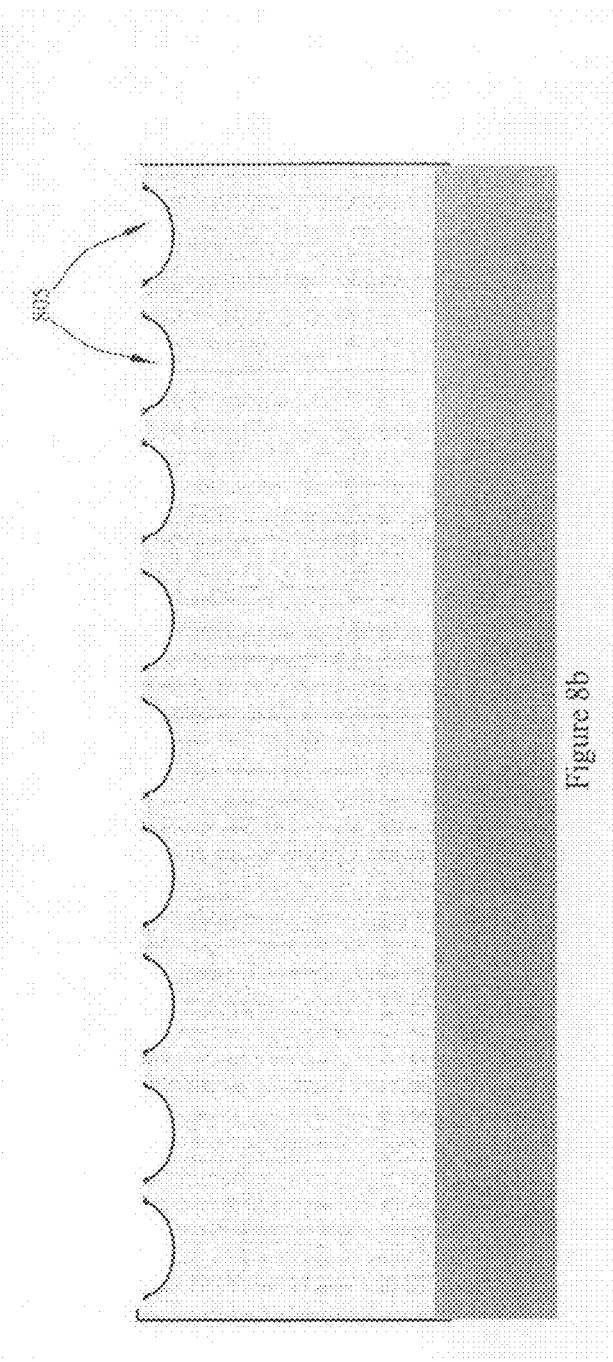

LIGHT EMITTING DIODE DEVICE, AND MANUFACTURE AND USE THEREOF

FIELD OF THE INVENTION

The invention relates to light emitting diodes (LEDs) and more particularly to LEDs having enhanced side emission.

BACKGROUND OF THE INVENTION

LEDs are semiconductor devices that emit lights when an electrical current is supplied thereto. As shown in FIGS. 1a and 1b, typically, an LED 100 is formed of multiple layers of materials having a layer of p-doped material or p-type semiconductor layer ("p-layer") 101, a layer of n-doped material or an n-type semiconductor layer ("n-layer") 103, and a light generating region or p-n junction 105. When powered, the p-n junction emits lights in a primary direction 107 towards one of the p- and n-layers creating a field of illumination 109 roughly along a longitudinal axis parallel to the direction 107.

In certain applications of LEDs, for example in a backlight illumination system, it may be desirable to convert the LED's light illumination field 109 into a "bat-wing" light illumination field 201 as illustrated in FIG. 2. Conventionally, complicated optical designs have been adopted in the packaging of the LED, which may make the LED packaging unnecessarily bulky.

It is an object of the present invention to provide a light emitting device, which overcomes at least some of the deficiencies exhibited by those of the prior art.

SUMMARY OF THE INVENTION

According to a first aspect of the present invention, there is provided a light emitting diode device. The light emitting diode device includes a multi-layer stack of materials including a p-layer, a n-layer, and a light generating region for emission of light in a primary emission direction towards one of the p- and n-layers; a substantially transparent layer located at or adjacent said one of the p- and n-layers, having a first surface facing said one of the p- and n-layers and an opposed second surface; and a reflective surface formed at or adjacent the second surface of the transparent layer for directing at least a portion of the emitted light in a direction away from the primary emission direction so as to enhance light emission from a side of the light emitting diode device.

According to a second aspect of the present invention, there is provided an illumination system. The illumination system includes:
 an elongate substrate;
 a plurality of light emitting diode devices positioned on the substrate, each light emitting diode device including
  a multi-layer stack of materials including a p-layer, a n-layer, and a light generating region for emission of light in a primary emission direction towards one of the p- and n-layers;
  a substantially transparent layer located at or adjacent said one of the p- and n-layers, having a first surface facing said one of the p- and n-layers and an opposed second surface; and
  a reflective surface formed at or adjacent the second surface of the transparent layer for directing at least a portion of the emitted light in a direction away from the primary emission direction so as to enhance light emission from a side of the light emitting diode device.

According to a further aspect of the present invention, there is provided a process for fabricating a light emitting diode device. The process includes
 forming a multi-layer stack of materials including a p-layer, a n-layer, and a light generating region for emission of light in a primary emission direction towards one of the p- and n-layers;
 positioning a substantially transparent layer at or adjacent said one of the p- and n-layers, the transparent layer having a first surface facing said one of the p- and n-layers and an opposed second surface; and
 forming a reflective surface at or adjacent the top surface of the transparent layer for reflecting at least a portion of the emitted light in a direction away from the primary emission direction so as to enhance light emission from a side of the light emitting diode device.

Other aspects and advantages of the invention will become apparent from the following detailed description, taken in conjunction with the accompanying drawings, which description illustrates by way of example the principles of the invention.

BRIEF DESCRIPTION OF THE DRAWINGS

The invention now will be described, by way of example only, and with reference to the accompanying drawings in which:

FIG. 3b is a perspective view of a reflective layer of the LED device of FIG. 3a;

FIG. 3c is a graph of the angular intensity distribution for the LED device of FIG. 3a;

FIG. 3d illustrates the field of illumination for the LED device of FIG. 3a;

FIG. 4 is a cross sectional view illustrating a second embodiment of an LED device according to the present invention;

FIGS. 8a and 8b illustrate a first process of fabricating a reflective surface useful in the exemplary embodiments according to the present invention.

DETAILED DESCRIPTION

Figure 1A:
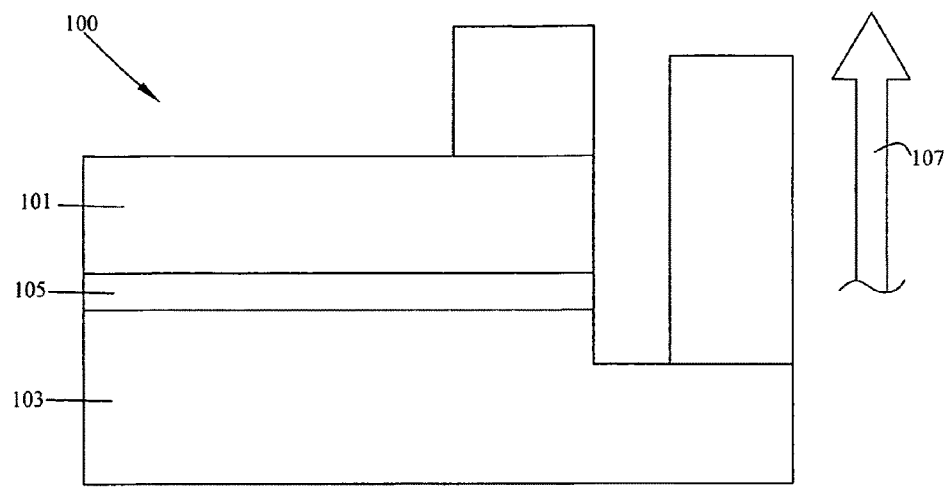
FIGS. 1a and 1b illustrate a prior art light emitting diode device and its field of illumination.
Figure 1B:
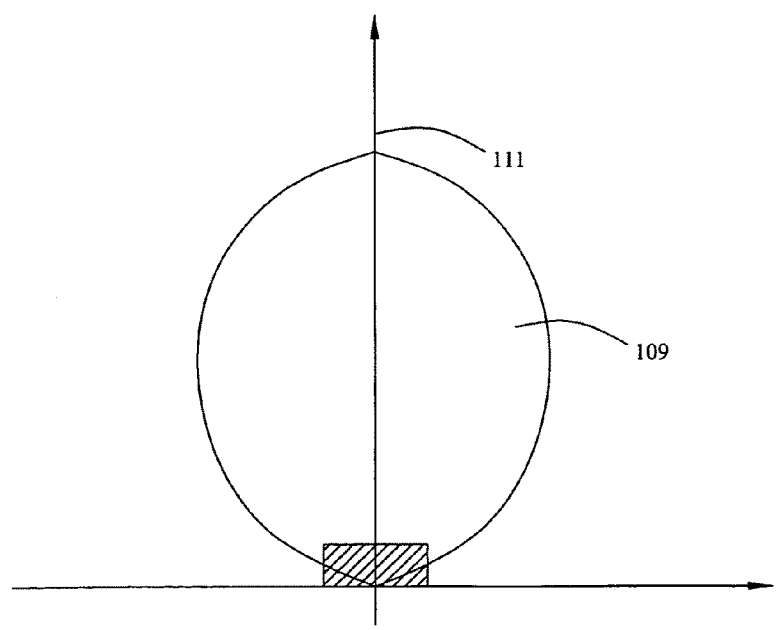
Figure 2:
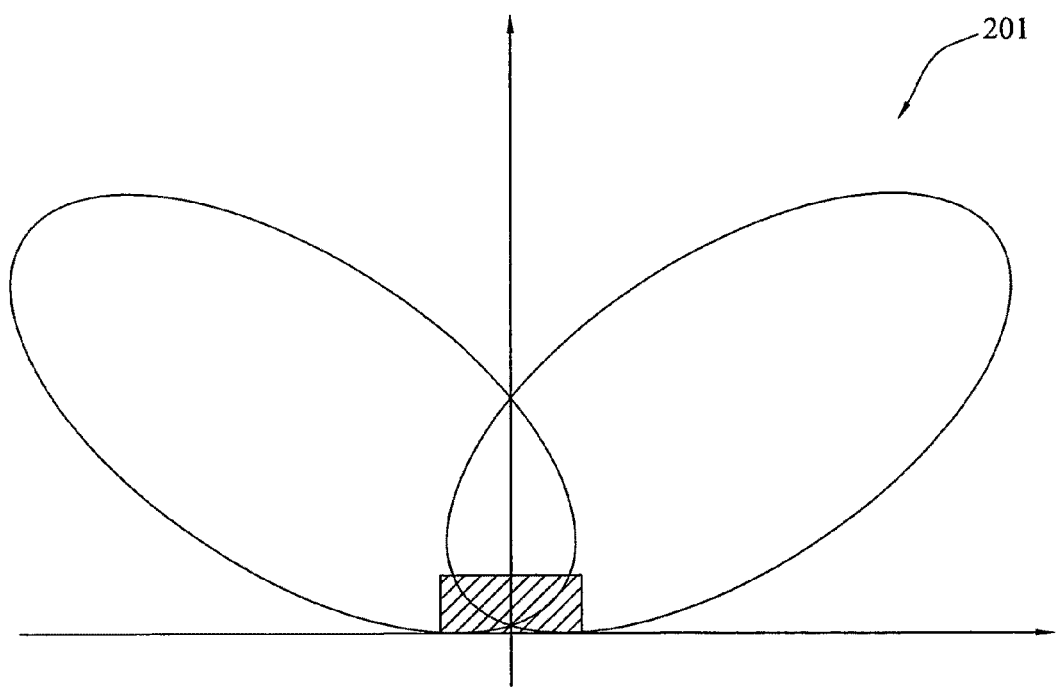
FIG. 2 illustrates a desirable light illumination field of an LED device.

The following description refers to exemplary embodiments of a semiconductor light emitting device of the present invention. Reference is made in the description to the accompanying drawings whereby the light emitting diode is illustrated in the exemplary embodiments. Similar components between the drawings are identified by the same reference numerals.

Figure 3A:
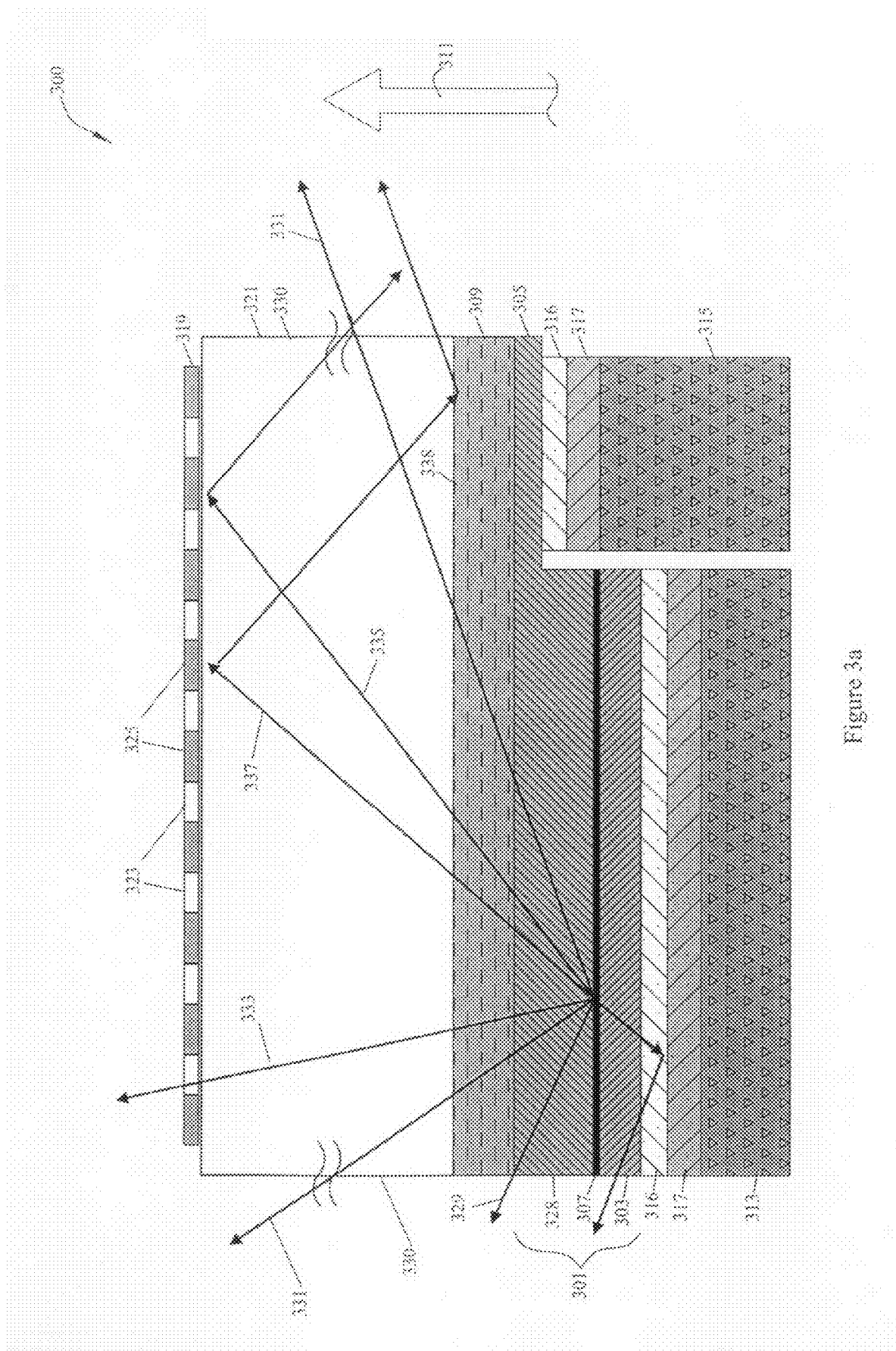
FIG. 3a is a cross sectional view illustrating a first embodiment of an LED device according to the present invention.
Figure 3B:
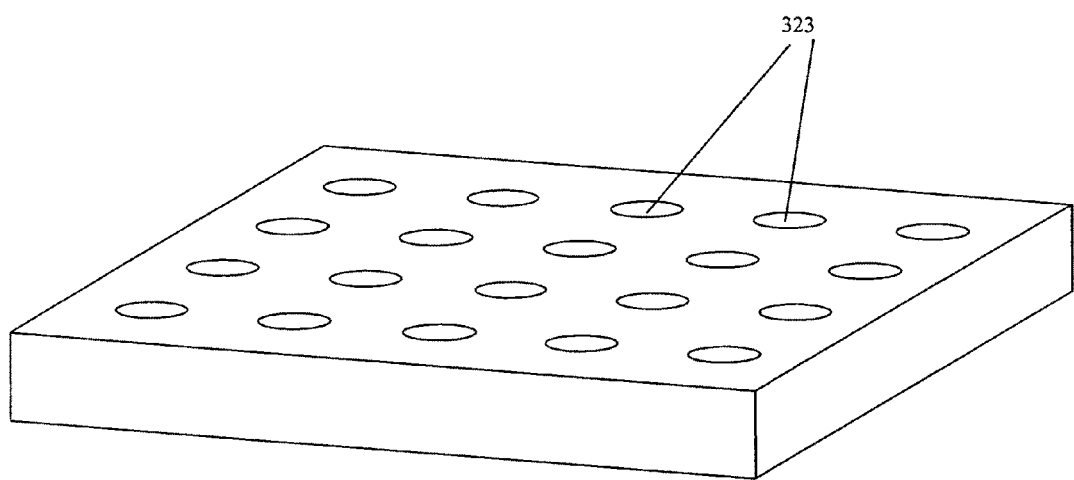

In FIGS. 3a and 3b, an exemplary embodiment of flip-chip light emitting diode (LED) device 300 according to the present invention is shown. The flip-chip LED device 300 has a multi-stack 301 including a layer of p-doped material or p-type semiconductor layer 303, a layer of n-doped material or an n-type semiconductor layer 305, and a light generating region or p-n junction 307 as generally understood in the art. When powered, the p-n junction 307 emits lights in all directions, however, a primary amount of light emissions will propagate through a substantially transparent substrate 309 attached to a top surface of the n-layer 305 in a primary light emitting direction indicated by arrow 311. The flip-chip LED device 300 has p-electrode 313 and n-electrode 315 for supplying electrical power to the p- and n-layers 303, 307 respectively and can also have a conductive and transparent layer such as ITO thin film 316 sandwiched between the electrodes 313, 315 and respective semiconductor layers 303, 307 for improving the electrical connections therebetween as will be understood by an ordinarily skilled person in the art. The flip-chip LED device 300 can further have a metal mirror layer 317 between the ITO film 316 and the respective electrodes 313, 315 for reflecting lights towards the primary light emitting direction 311 as will be understood by an ordinarily skilled person in the art.

The flip-chip LED device 300 further includes a patterned reflective layer 319, which forms the top surface of the flip-chip LED device 300, and a substantially transparent layer 321 sandwiched between the reflective layer 319 and the substrate 309.

In the exemplary embodiment, the reflective layer 319 is formed from a reflective material, such as aluminum, gold, silver, chromium, 1-dimensional photonic crystal structure, or the like, and provided with a plurality of apertures 323 extending therethrough so as to form a plurality of spaced-apart reflective mirrors 325.

As shown in FIG. 3a, the p-n junction 307 emits lights in all directions. Some light 329 may exit the side surface 328 of the substrate 309 directly; some light may propagate through the substrate 309 and exit the side surface 330 of the transparent layer 321. Some light 333 may propagate through the substrate 309, the transparent layer 321, and the apertures 323 on the reflective layer 319 such that these lights exit the flip-chip LED device 300 through its top surface defined by the reflective layer 319. Some light 335 may propagate through the substrate 309 and the transparent layer 321, and then be reflected by the reflective mirrors 325 in a direction such that these lights exit the flip-chip LED device 300 through the side surface 330 of the transparent layer 321. Some light 337 may propagate through the substrate 309 and the transparent layer 321, be reflected by the reflective mirrors 325 and further reflected by the top surface 338 of the substrate 309 in a direction such that this light exit the flip-chip LED device 300 through the side surface 330 of the transparent layer 321.

Figure 3C:
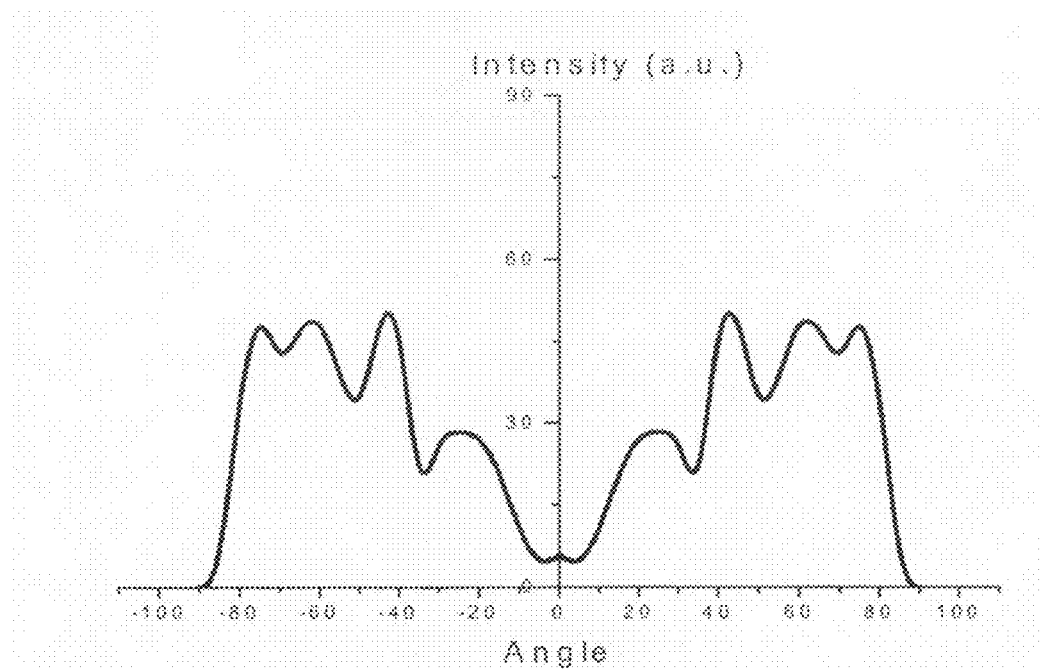
Figure 3D:
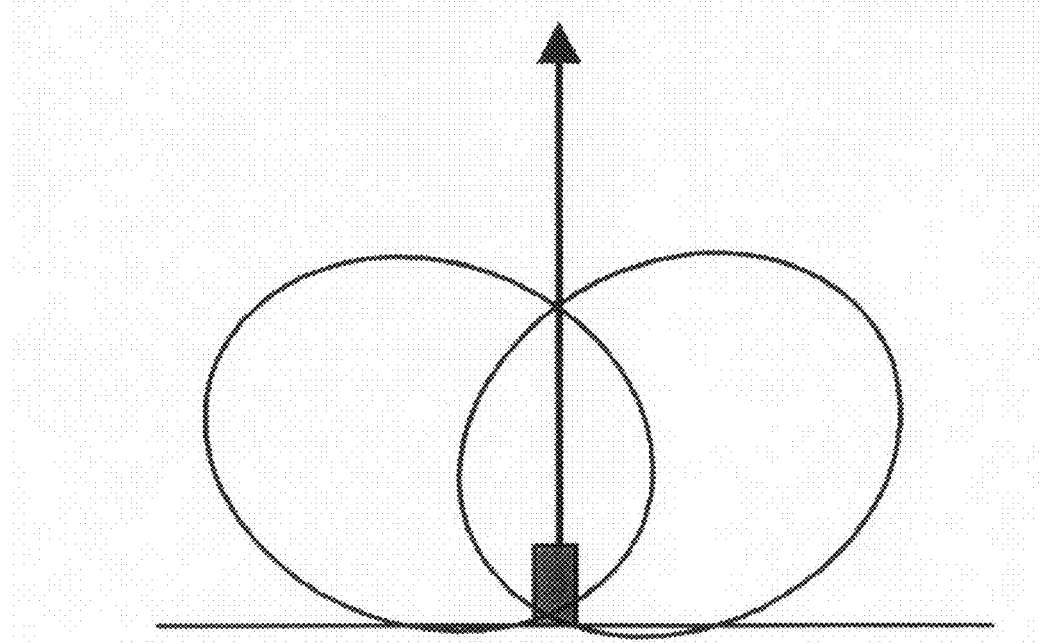

Therefore, a skilled person in the art will appreciate that such an LED device with a patterned reflective layer distanced from the p-n junction can enhance light emission from its side surface, which may include the side surfaces of the multi-layer stack, the substrate and the transparent layer, and therefore can produce a desired "bat-wing" light illumination field. FIGS. 3c and 3d respectively illustrate the angular intensity distribution and field of illumination for such an LED device.

A skilled person will further appreciate that such an LED device with enhanced side light emissions can be achieved at the wafer level and therefore does not require unnecessarily complicated optical designs at the packaging level. As such, a relatively compact side-emitting LED device can be achieved.

In the exemplary LED device 300, the transparent layer 321 has a thickness of approximately identical to that of the substrate. A skilled person will appreciate that a thicker transparent layer may cause more side light emissions. Therefore the thickness of the transparent layer will depend upon the desired light illumination field pattern and the size requirement on the LED device, although preferably it is at least one third of the thickness of the substrate. An ordinarily skilled person in the art will also appreciate that in a flip-chip LED device, the transparent layer may not be necessary, and the reflective layer or surface can be formed at the top surface of the transparent substrate such that light reflected by the reflective layer exits the flip-chip LED device through the side surface of the transparent layer.

In addition, the transparent layer 321 can be formed from transparent materials such as $SiO_2$, epoxy, polymeric material, glass, or the like, and preferably has a refractive index greater than the refractive index of the substrate, which is very often formed from sapphire in a typical LED device. Such a selection of refractive index may enhance light side emission by reducing the light reflection as light propagates from the substrate into the transparent layer and by enhancing the reflection as light propagates in an opposite direction.

In FIG. 4, a second flip-chip LED device embodiment 400 further includes a 2-dimensional photonic crystal structure 401 formed between the substrate 403 and the transparent layer 405 for extracting lights from the substrate 403 towards the transparent layer 405, and the 2-dimensional photonic crystal structure 401 has a photonic band gap covering at least a segment of a wavelength range of the lights emitted by p-n junction 407. The fabrication and application of such a 2-dimensional photonic crystal structure is described in detail in a co-pending US patent application entitled "Semiconductor Light Emitting Device" and filed by Yan Hung et al., the contents of which are herein incorporated by reference.

Figure 5:
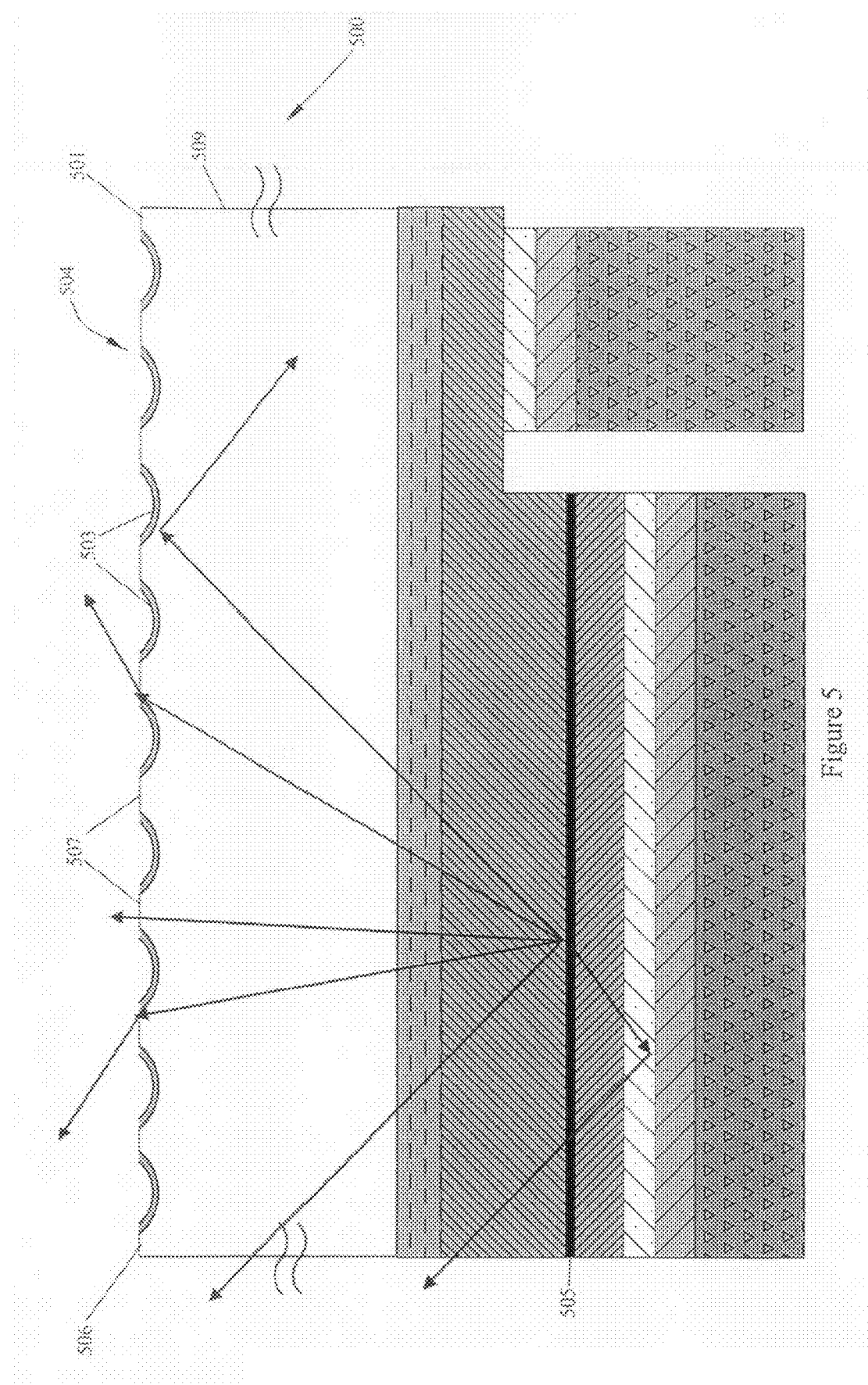
FIG. 5 is a cross sectional view illustrating a third embodiment of an LED device according to the present invention.

In a third flip-chip LED device embodiment 500 illustrated in FIG. 5, the reflective mirrors 503 on the reflective layer 501 have a U-shape or a convex shape. The convex shaped reflective mirrors can be formed by firstly creating a plurality of concave shaped recesses 504 on the top surface 506 of the transparent layer 509 and then depositing a layer of reflective material onto each recess 504.

As compared to the flat reflective mirrors shown in FIGS. 3a and 4, the convex-shaped reflective mirror design may reduce light reflections towards the p-n junction and therefore may increase light emissions out of the LED device. Furthermore, such an LED device may achieve more complicated and/or better controlled light illumination field patterns by adjusting the size and dimensions of the convex-shaped reflective mirrors 503, the size of the apertures 507 between the reflective mirrors 503, and the thickness of the transparent layer 509.

Figure 6:
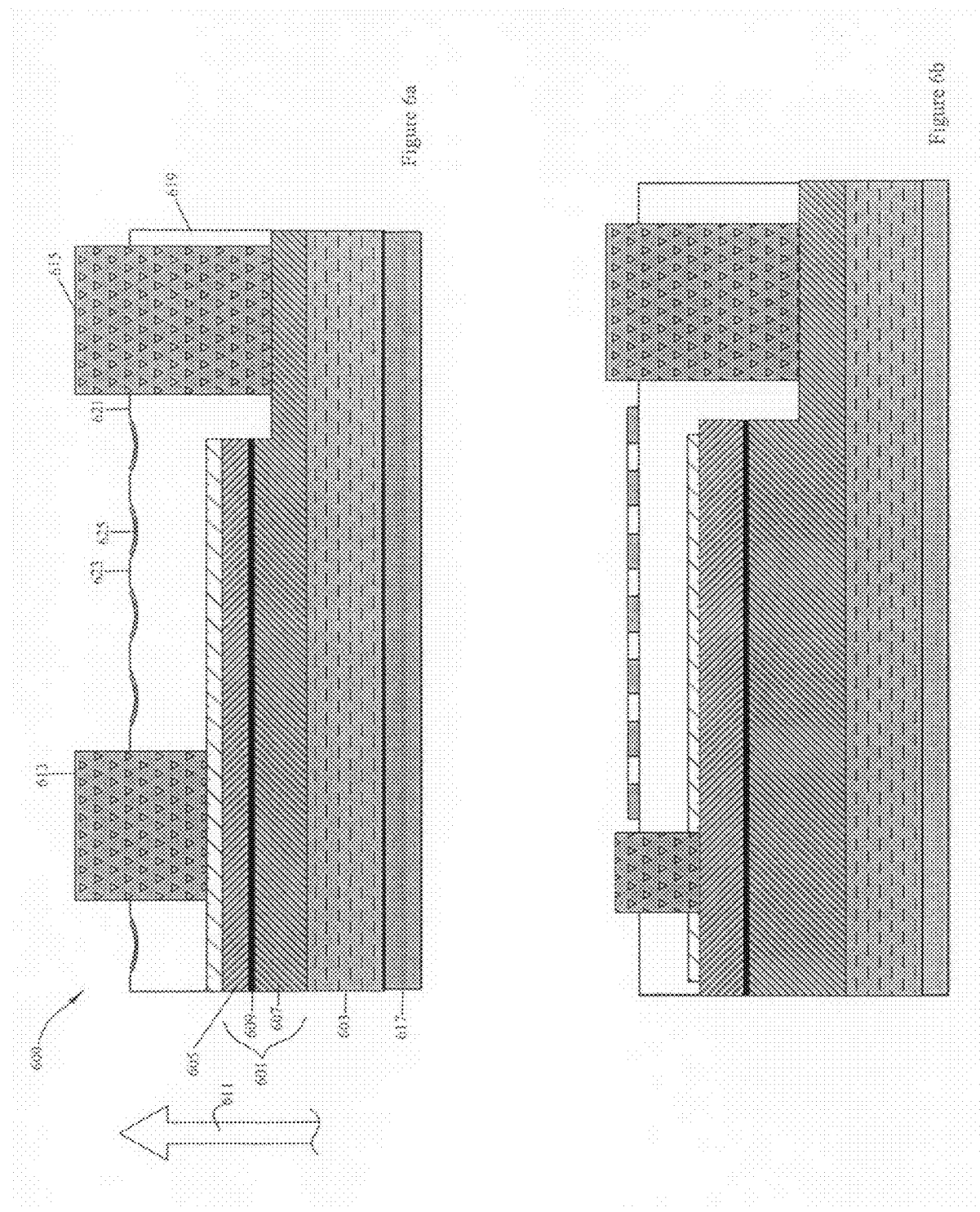
FIG. 6a is a cross sectional view illustrating a fourth embodiment of an LED device according to the present invention.
FIG. 6b is a cross sectional view illustrating a fifth embodiment of an LED device according to the present invention.

FIG. 6a illustrates an exemplary embodiment of a top-emitting LED device 600 includes a multi-layer stack 601 of materials formed on a substrate 603. The multi-layer stack 601 includes a layer of p-doped material or p-type semiconductor layer ("p-layer") 605, a layer of n-doped material or an n-type semiconductor layer 607 ("n-layer"), and a light generating region or p-n junction 609 as generally understood in the art. When powered, the p-n junction 609 emits lights in all directions, but a primary amount of light emissions will exit the top-emitting semiconductor light emitting device 600 in a primary light emitting direction indicated by arrow 611, as will be understood in the art. The top-emitting semiconductor light emitting device 600 can also have p-electrode 613 and n-electrode 115 for supplying electrical power to the p- and n-layers 605, 607. Optionally, a reflective layer can be attached to a bottom surface of the substrate 603 for reflecting lights towards the primary direction 611. The top emitting LED device further includes a thick transparent layer 619 on or adjacent the p-layer 605 and a patterned reflective layer 621 attached to a top surface of the transparent layer 610 with a plurality of apertures 623 spacing apart a plurality of convex-shaped reflective mirrors 625.

FIG. 6b illustrates another embodiment of a top-emitting LED device similar to the one of FIG. 6a except that the reflective mirrors are substantively flat. In addition, a 2-dimensional photonic crystal structure with a suitable photonic band gap may be included between the p-layer and the transparent layer for enhancing light emissions entering into the transparent layer.

Figure 7:
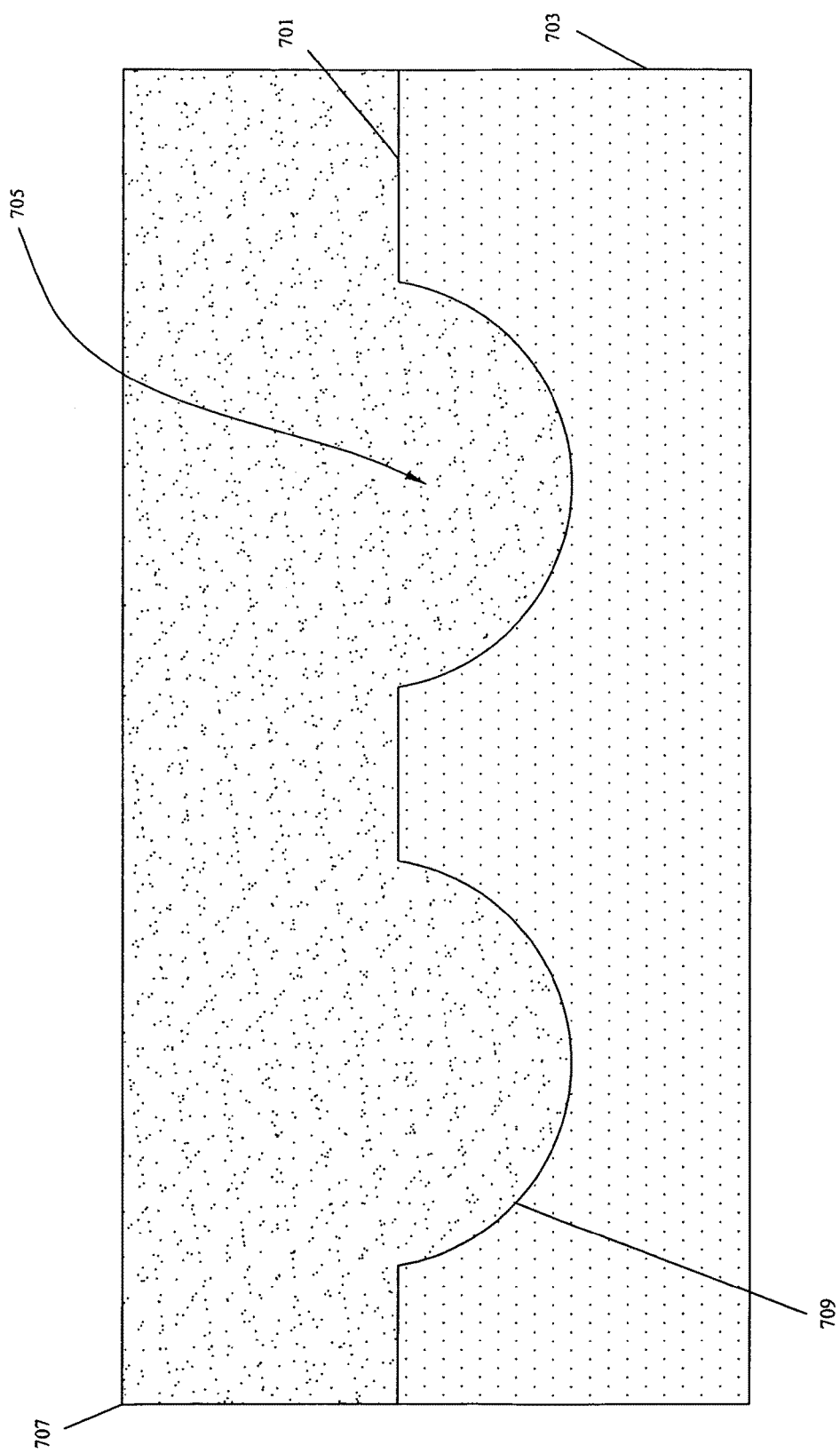
FIG. 7 is a cross sectional view illustrating one form of a reflective surface for the present invention.

FIG. 7 illustrates another way of forming the reflective mirrors according to the present invention. By way of example, the creation of convex-shaped reflective mirrors is described, however a skilled person will appreciate that such a process may also be suitable for the creation of flat reflective mirrors. As shown in FIG. 7, firstly, the top surface 701 of the transparent layer 703 is etched or by other means to form a plurality of recesses 705. Thereafter, a second transparent layer 707, having a refractive index different from and preferably smaller than the refractive index of transparent layer 703, is coated onto the top surface 701 of transparent layer 703 filling the recesses 705. The interfaces 709 between the two transparent layers 703, 707 act as the reflective mirrors.

Figure 9A:
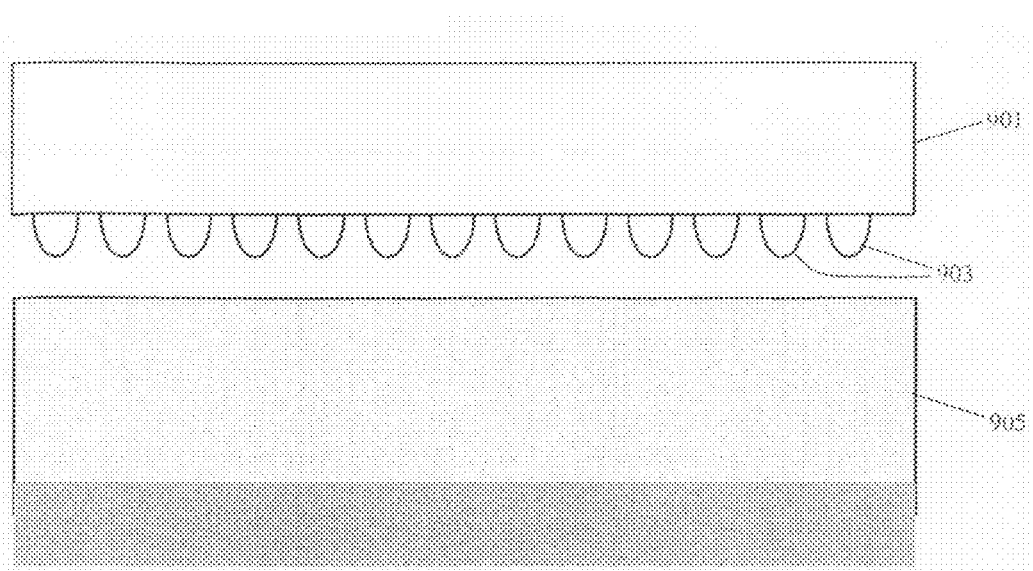
FIGS. 9a, 9b and 9c illustrate a first process of fabricating a reflective surface useful in the exemplary embodiments according to the present invention.
Figure 9B:
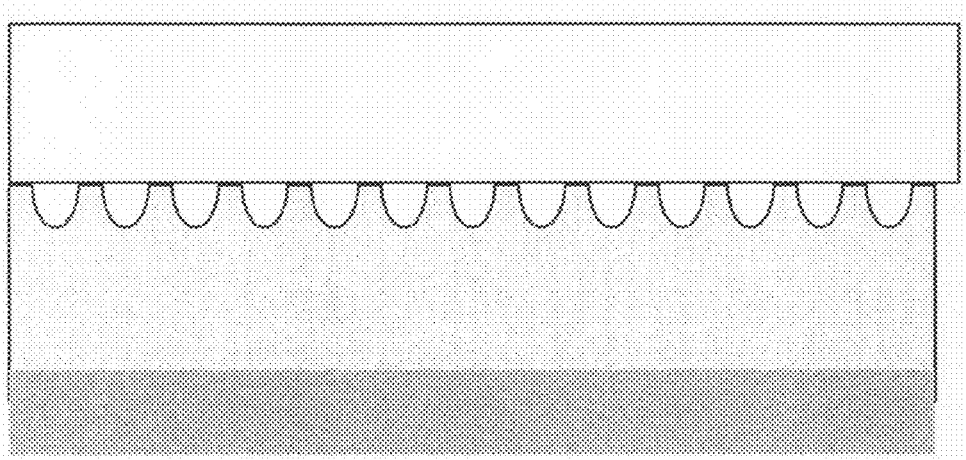
Figure 9C:
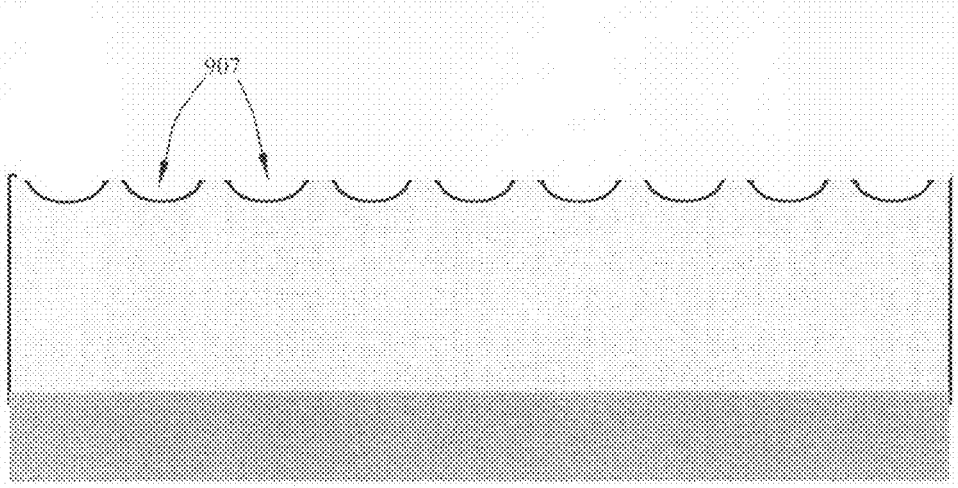

Various processes can be used to form the recesses on the transparent layer. For example, as shown in FIGS. 8a and 8b, an etching resist layer 801 with apertures 802 is firstly attached onto the transparent layer 803, and then followed by a chemical etching process to form the recesses 804. Alternatively, as shown in FIGS. 9a-9c, a physical printer 901 with a plurality of projections 903 thereon can be used to apply a physical force onto the transparent layer 905 to form the recesses 907 on the transparent layer.

The LED device with enhanced side emission may have various applications. For example, it can be used in a backlight illumination system, which typically has an elongate substrate with a plurality of such LEDs mounted thereon. Since each LED device is now provided with enhanced side emission, the pattern of which can be controlled, reduction in the packaging complexity and controlled light intensity of such an illumination system may also be achieved.

It will be understood that the invention disclosed and defined herein extends to all alternative combinations of two or more of the individual features mentioned or evident from the text or drawings. All of these different combinations constitute various alternative aspects of the invention. The foregoing describes an embodiment of the present invention and modifications, apparent to those skilled in the art can be made thereto, without departing from the scope of the present invention.

Although the invention is illustrated and described herein as embodied, it is nevertheless not intended to be limited to the details described, since various modifications and structural changes may be made therein without departing from the spirit of the invention and within the scope and range of equivalents of the claims.

Furthermore, it will be appreciated and understood that the words used in this specification to describe the present invention and its various embodiments are to be understood not only in the sense of their commonly defined meanings, but also to include by special definition in this specification structure, material or acts beyond the scope of the commonly defined meanings. Thus, if an element can be understood in the context of this specification as including more than one meaning, then its use in a claim must be understood as being generic to all possible meanings supported by the specification and by the word itself. The definitions of the words or elements of the following claims are, therefore, defined in this specification to include not only the combination of elements which are literally set forth, but all equivalent structure, material or acts for performing substantially the same function in substantially the same way to obtain substantially the same result, without departing from the scope of the invention.

What is claimed is:

1. A light emitting diode device comprising:
    a multi-layer stack of materials including a p-layer, a n-layer, and a light generating region for emission of light in a primary emission direction towards one of the p- and n-layers;
    a substantially transparent layer located at or adjacent said one of the p- and n-layers, having a first surface facing said one of the p- and n-layers and an opposed second surface; and
    a patterned reflective surface formed at or adjacent the second surface of the transparent layer, said patterned reflective surface including apertures for allowing a portion of light to propagate therethrough, the patterned reflective surface also including a plurality of convex-shaped mirrors for reflecting a majority of light along both a direct emission path via a side surface of the light emitting diode and along an indirect emission path via a side surface of the light emitting diode.

2. The light emitting diode device of claim 1, wherein the light emitting device is a flip-chip light emitting device, wherein the light emitting diode device further comprises a substantially transparent substrate on which the multi-layer stack is formed, and wherein the substrate is sandwiched between said one of the p- and n-layers and the transparent layer.

3. The light emitting diode device of claim 2, wherein the transparent layer has a thickness of at least one third of that of the substrate.

4. The light emitting diode device of claim 2, wherein the transparent layer has a refractive index greater than the refractive index of the substrate.

5. The light emitting diode device of claim 1, wherein the light emitting device is a flip-chip light emitting device, wherein the transparent layer is formed from a transparent substrate on which the multi-layer stack is formed.

6. The light emitting diode device of claim 1, further comprising a 2-dimensional photonic crystal structure formed between the multi-layer stack and the transparent layer for extracting lights from the multi-layer stack towards the transparent layer, wherein the 2-dimensional photonic crystal structure has a photonic band gap covering at least a segment of a wavelength range of the lights emitted by the light generating region.

7. The light emitting diode device of claim 1, wherein the transparent layer includes a plurality of recesses at its second surface for forming the convex shaped reflective mirrors.

8. The light emitting diode device of claim 7, further comprising a second transparent layer having a refractive index lower than the refractive index of the transparent layer and being located at or adjacent the second surface of the transparent layer for forming the reflective surface.

9. The light emitting diode device of claim 1, wherein the reflective surface is formed from a reflective material deposited on the top surface of the transparent layer.

10. The light emitting diode device of claim 9, wherein the reflective material is selected from a group including aluminum, gold, silver, chromium, 1-dimensional photonic crystal, or the like.

11. A process for fabricating a light emitting diode device of claim 1, comprising forming a multi-layer stack of materials including a p-layer, a n-layer, and a light generating region for emission of light in a primary emission direction towards one of the p- and n-layers;

positioning a substantially transparent layer at or adjacent said one of the p- and n-layers, the transparent layer having a first surface facing said one of the p- and n-layers and an opposed second surface; and forming a patterned reflective surface at or adjacent the top surface of the transparent layer, said patterned reflective surface including apertures for allowing a portion of light to propagate therethrough, the patterned reflective surface also including a plurality of convex-shaped mirrors for reflecting a majority of light along both a direct emission path via a side surface of the light emitting diode and along an indirect emission path via a side surface of the light emitting diode.

12. The process of claim 11, wherein the convex-shaped reflective mirrors are formed by forming a plurality of recesses on the top surface of the transparent layer.

13. The process of claim 12, wherein the recesses are formed by etching the transparent layer.

14. The process of claim 12, wherein the recesses are formed by applying an external force onto the transparent layer.

* * * * *